(12) United States Patent
Jourdain et al.

(10) Patent No.: US 10,985,057 B2
(45) Date of Patent: Apr. 20, 2021

(54) METHOD FOR CONTACTING A BURIED INTERCONNECT RAIL OF AN INTEGRATED CIRCUIT CHIP FROM THE BACK SIDE OF THE IC

(71) Applicant: IMEC vzw, Leuven (BE)

(72) Inventors: Anne Jourdain, Grez-Doiceau (BE); Nouredine Rassoul, Braine l'Alleud (BE); Eric Beyne, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/675,080

(22) Filed: Nov. 5, 2019

(65) Prior Publication Data

US 2020/0152508 A1 May 14, 2020

(30) Foreign Application Priority Data

Nov. 12, 2018 (EP) ...................................... 18205606

(51) Int. Cl.
*H01L 21/768* (2006.01)
*H01L 21/308* (2006.01)
(Continued)

(52) U.S. Cl.
CPC ...... *H01L 21/76831* (2013.01); *H01L 21/308* (2013.01); *H01L 21/3212* (2013.01);
(Continued)

(58) Field of Classification Search
CPC ............. H01L 21/76831; H01L 21/486; H01L 21/4832; H01L 21/463; H01L 21/3212; H01L 23/5384
See application file for complete search history.

(56) References Cited

U.S. PATENT DOCUMENTS 8,841,754 B2 * 9/2014 Kang ................ H01L 21/76877
257/621
9,171,753 B2 * 10/2015 Lee ................... H01L 21/02271
(Continued)

FOREIGN PATENT DOCUMENTS

| EP | 3 035 369 A1 | 6/2016 |
| EP | 3 324 436 A1 | 5/2018 |
| JP | 2005-032839 | 3/2005 |

OTHER PUBLICATIONS

Extended European Search Report dated May 20, 2019 issued in European Application No. 18205606.9.

*Primary Examiner* — Zandra V Smith
*Assistant Examiner* — Abbigale A Boyle
(74) *Attorney, Agent, or Firm* — Knobbe Martens Olson & Bear LLP

(57) ABSTRACT

A method for producing an integrated circuit (IC) chip on a semiconductor device wafer is disclosed. In one aspect, the IC chip includes buried interconnect rails in the front end of line and a power delivery network (PDN) on the back side of the chip. The PDN is connected to the front side by micro-sized through semiconductor via (TSV) connections through the thinned semiconductor wafer. The production of the TSVs is integrated in the process flow for fabricating the interconnect rails, with the TSVs being produced in a self-aligned manner relative to the interconnect rails. After bonding the device wafer to a landing wafer, the semiconductor layer onto which the active devices of the chip have been produced is thinned from the back side, and the TSVs are exposed. The self-aligned manner of producing the TSVs enables scaling down the process towards smaller dimensions without losing accurate positioning of the TSVs.

10 Claims, 14 Drawing Sheets

(51) Int. Cl.
H01L 21/321 (2006.01)
H01L 21/463 (2006.01)
H01L 21/48 (2006.01)
H01L 23/538 (2006.01)

(52) U.S. Cl.
CPC .......... H01L 21/463 (2013.01); H01L 21/486 (2013.01); H01L 21/4832 (2013.01); H01L 23/5384 (2013.01)

(56) References Cited

U.S. PATENT DOCUMENTS

| | | | |
|---|---|---|---|
| 9,379,042 B2* | 6/2016 | Park | H01L 27/10823 |
| 2011/0260248 A1* | 10/2011 | Smeys | H01L 23/522 |
| | | | 257/347 |
| 2012/0199916 A1 | 8/2012 | Oyu | |
| 2015/0162295 A1 | 6/2015 | Tseng et al. | |
| 2018/0145030 A1* | 5/2018 | Beyne | H01L 21/823821 |
| 2018/0247856 A1* | 8/2018 | Kar-Roy | H01L 21/76898 |

* cited by examiner

METHOD FOR CONTACTING A BURIED INTERCONNECT RAIL OF AN INTEGRATED CIRCUIT CHIP FROM THE BACK SIDE OF THE IC

CROSS-REFERENCE TO RELATED APPLICATIONS

This application claims foreign priority to European Patent Application No. 18205606.9, filed Nov. 12, 2018, the contents of which are incorporated by reference herein in their entirety.

BACKGROUND

Technological Field

The disclosed technology is related to integrated circuit chips, hereafter abbreviated to ICs or IC chips, in particular to the aspect of the delivery of power to the active devices on the chip.

Description of the Related Technology

Semiconductor processing for the fabrication of integrated circuit chips continues to evolve towards increasing device-density: higher numbers of active devices (mainly transistors) of ever decreasing device dimensions are placed on a given surface of semiconductor material. This has put a strain on the design and fabrication of the interconnects between the front end of line of the IC, consisting mainly of the active devices, and the contact terminals of the IC. Traditionally, all of these interconnects are incorporated in the back end of line of the IC: a stack of metallization layers on top of the front end of line and including layers of circuitry interconnected by vertical via connections. The power delivery network or PDN is specifically formed by conductors and vias connected to VDD/VSS terminals of the chip, for delivering power to the individual devices in the front end of line. The integration of this power delivery network in the back end of line has become particularly challenging because of the above-named increase in the device density.

One known solution to this problem consists in the production of the majority of layers of the power delivery network on the back side of the IC instead of on the front side. These layers are thus not formed on top of the front end of line, but on the opposite side of the IC, i.e. on the backside of the semiconductor substrate onto which the active devices have been built.

European Patent Publication No. EP3324436 describes an IC having the PDN that is integrally formed on the backside of the chip. This is achieved through the fabrication of buried interconnect rails embedded in the shallow trench isolation (STI) oxide, during front end of line processing of the IC, performed on a device wafer. After bonding of the device wafer to a landing wafer, the device wafer is thinned and through semiconductor vias (TSV) are etched from the back side, through the thinned substrate. This process is, however, not scalable to the very small dimensions to which the semiconductor industry is evolving. Because of the wafer distortion induced during bonding, the buried rail pattern deformation within the wafer or within an IC is not linear and cannot be fully compensated during TSV patterning. This partial compensation does not allow a perfect alignment of backside TSVs to frontside buried interconnect rails all across the wafer. The residual overlay will also vary across the wafer, depending on the wafer bonder and bonding mechanism being used. Therefore, this backside approach is limited to relaxed pitches and critical dimensions (CD) of a few hundreds of nanometers.

SUMMARY OF CERTAIN INVENTIVE ASPECTS

The disclosed technology aims to provide a method of contacting buried interconnect rails that is scalable beyond the above-described implementations. This is achieved by the methods of the disclosed technology. The method of the disclosed technology is applicable in the production of an integrated circuit chip on a semiconductor device wafer, the IC including buried interconnect rails in the front end of line and a power delivery network (PDN) on the back side of the chip. The PDN is connected to the front side by micro-sized through semiconductor via (TSV) connections through the thinned semiconductor wafer. Contrary to existing methods, the production of the TSVs is integrated in the FEOL process flow for fabricating the interconnect rails, with the TSVs being produced in a self-aligned manner relative to the interconnect rails. After flipping and bonding the device wafer to a landing wafer, the semiconductor layer onto which the active devices of the chip have been produced is thinned from the back side, and the TSVs are exposed, so that they may be contacted by the PDN produced on the back side. The self-aligned manner of producing the TSVs enables scaling down the process towards smaller dimensions without losing accurate positioning of the TSVs.

The disclosed technology is in particular related to a method for producing an integrated circuit chip including:
  providing a device substrate including a semiconductor material at least on its upper surface, and producing a front end of line (FEOL) portion of the chip on the semiconductor material of the device substrate, wherein the FEOL portion includes active devices and interconnect rails, the interconnect rails being at least partially embedded in a shallow trench isolation (STI) dielectric layer,
  producing a back end of line (BEOL) portion on the FEOL portion,
  bonding the device substrate to a landing substrate (26), with the surface of the BEOL portion being bonded to a surface of the landing substrate, and thereafter:
  thinning the device substrate from the back side,
  producing a power delivery network (PDN) on the thinned backside of the device substrate, wherein the PDN is connected to the interconnect rails by a plurality of through semiconductor vias (TSV) which are isolated from the semiconductor material of the device substrate by a dielectric liner,
wherein:
  the TSVs are formed during the production of the FEOL portion on the device substrate, the TSVs extending into the semiconductor material of the device substrate and being formed in a self-aligned manner with respect to the interconnect rails, the TSVs being self-aligned to the rails in the direction perpendicular to the rails, with the liner isolating the TSVs laterally and on the bottom of the TSVs,
  thinning the device substrate includes thinning the semiconductor material of the device substrate until the liner at the bottom of the TSVs is exposed, and
  the liner is subsequently removed from the bottom of the TSVs so as to allow the PDN to contact the TSVs.

According to an embodiment, the production of the interconnect rails and the TSVs includes:
producing a trench through the STI dielectric and extending into the semiconductor material of the device substrate,
providing a first dielectric liner on the bottom and the sidewalls of the trench, and thereafter:
providing a mask that defines at least one local open area extending across the longitudinal direction of the trench and on both sides of the trench,
removing the liner from the bottom of the trench in the at least one local open area, and thereafter:
etching a blind cavity extending underneath the trench, by a self-aligned etch process in the at least one local open area, the etch process being self-aligned to the trench in the direction perpendicular to the longitudinal direction of the trench,
providing a second dielectric liner on the bottom and the sidewalls of the blind cavity, and thereafter:
filling the blind cavity and the trench with an electrically conducting material, so as to create a rail having one of the TSVs extending locally and in a self-aligned manner from the bottom of the rail.

According to an embodiment, the device substrate includes a base substrate, an etch stop layer on top of the base substrate, and the semiconductor layer on top of the etch stop layer, and thinning the device substrate includes grinding and etching the base substrate from the back side, ending with an etch process that is stopped by the etch stop layer.

The base substrate may be a silicon substrate, the etch stop layer may be a SiGe layer and the semiconductor layer may be a monocrystalline silicon layer.

The device substrate may be a silicon-on-insulator substrate, including a silicon base substrate, an insulator layer acting as the etch stop layer, and a monocrystalline silicon layer on the insulator layer.

According to an embodiment, the device substrate is a monocrystalline substrate wherein the etch stop layer is formed by dopant elements implanted into the substrate and forming a layer at a given implant depth.

According to an embodiment, the etch stop layer furthermore stops the self-aligned etch process, so that the bottom of the blind cavity is formed by the etch stop layer.

According to another embodiment, the etch stop layer does not stop the self-aligned etch process, and the self-aligned etch process is continued until the bottom of the blind cavity protrudes through the etch stop layer.

The method of the disclosed technology may further include, after thinning the device substrate:
if applicable, removing the etch stop layer,
depositing a passivation layer,
opening the passivation layer at the location of the TSVs by lithography and by an etch process,
wherein removing the liner from the bottom of the TSVs so as to allow the PDN to contact the TSVs is performed by the etch process for opening the passivation layer, or by a subsequent etch process.

Alternatively, the liner may be removed from the bottom of the TSVs by chemical mechanical polishing (CMP). In the latter case, the TSVs including the liner may protrude from the thinned back side of the device substrate after thinning the device substrate, and a passivation layer may be deposited on the thinned back side and on the protruding TSVs, followed by the CMP step, wherein the CMP step planarizes the surface of the passivation layer, thereby removing the liner from the bottom of the TSVs.

BRIEF DESCRIPTION OF THE DRAWINGS

The enclosed figures are illustrating the main features of the disclosed technology. They are not drawn to scale and should not be regarded as technical drawings of real structures.

DETAILED DESCRIPTION OF CERTAIN ILLUSTRATIVE EMBODIMENTS

Figure 1A:
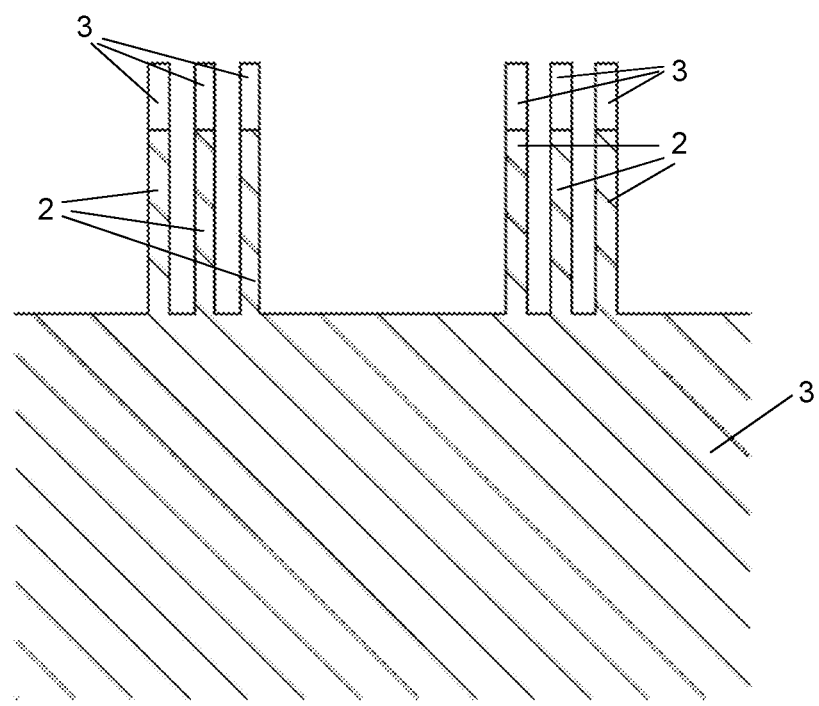
FIGS. 1A to 1K illustrate the fabrication of a microTSV extending from a buried interconnect rail by a self-aligned etch process, in accordance with the method of the disclosed technology applied on a silicon device wafer. The term microTSV is used herein to indicate that the dimensions of these TSVs are smaller than what is usually termed a TSV in the terminology used in semiconductor processing.

In the following detailed description, an embodiment of the method of the disclosed technology is described for the case of a CMOS layout of finFET transistors produced on a semiconductor device wafer. The disclosed technology is not limited to this particular application field, however. FIG. 1A shows a small portion of a device wafer, including a monocrystalline Si layer 1, into which a number of fins 2 have been produced by a suitable lithography and etch technique. The patterned mask 3 used for etching the fins is still present on top of the fins. The width of the fins may be in the order of 10 nm or less. Two groups of fins 2 are visible with a gap in between. This layout is typically used for producing pMOS and nMOS transistors on the two groups of fins respectively, as described for example in European Patent Publication No. EP3324436. The Si layer 1 may be the surface area of a bulk monocrystalline Si device wafer. Alternatively and as will be described in more detail below, the fins are produced on a monocrystalline upper layer of a multi-layer device wafer such as a silicon-on-insulator (SOI) wafer.

Figure 1B:
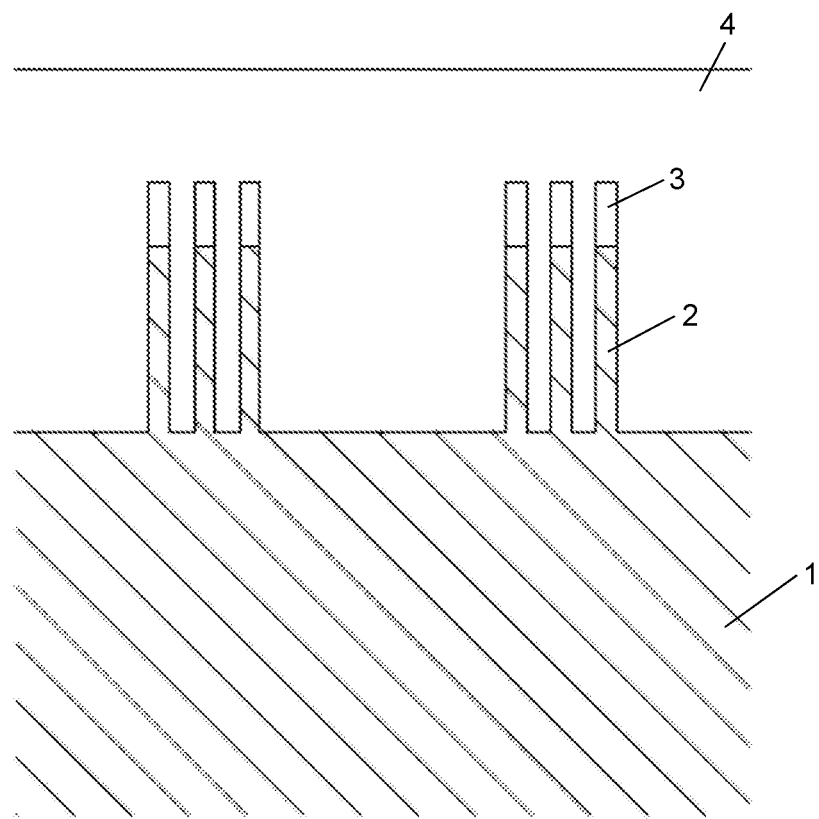
Figure 1C:
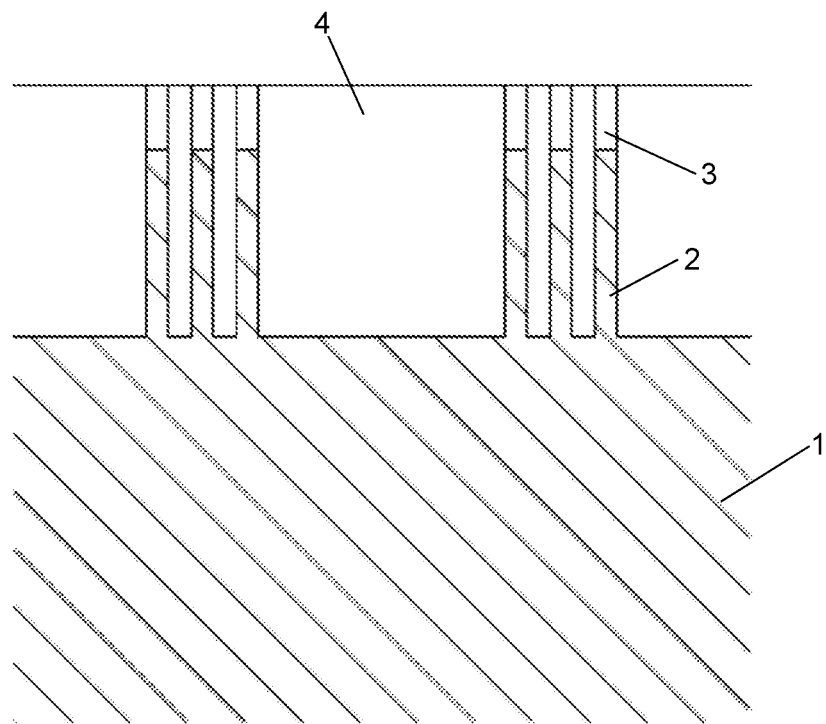
Figure 1D:
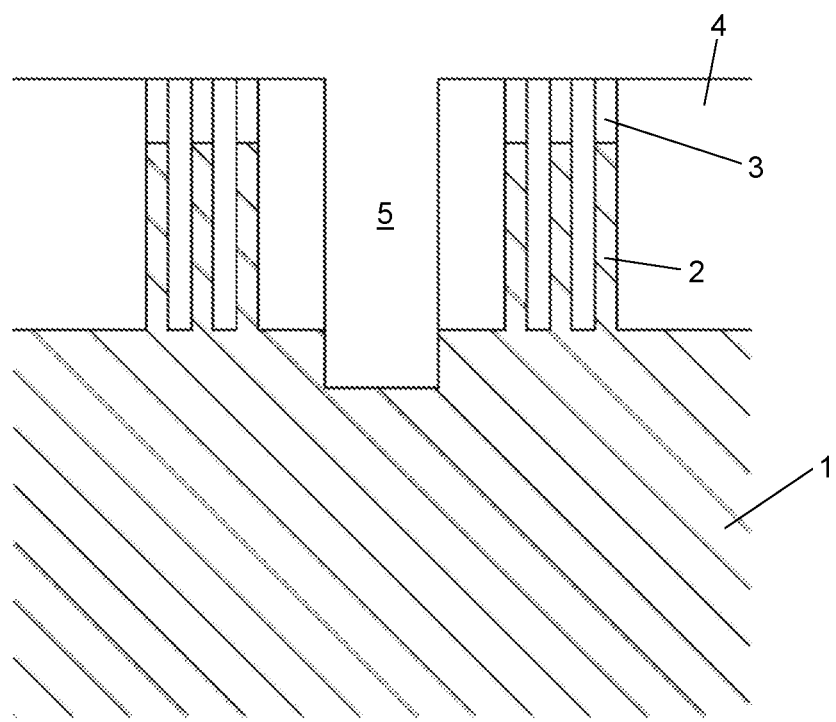
Figure 1E:
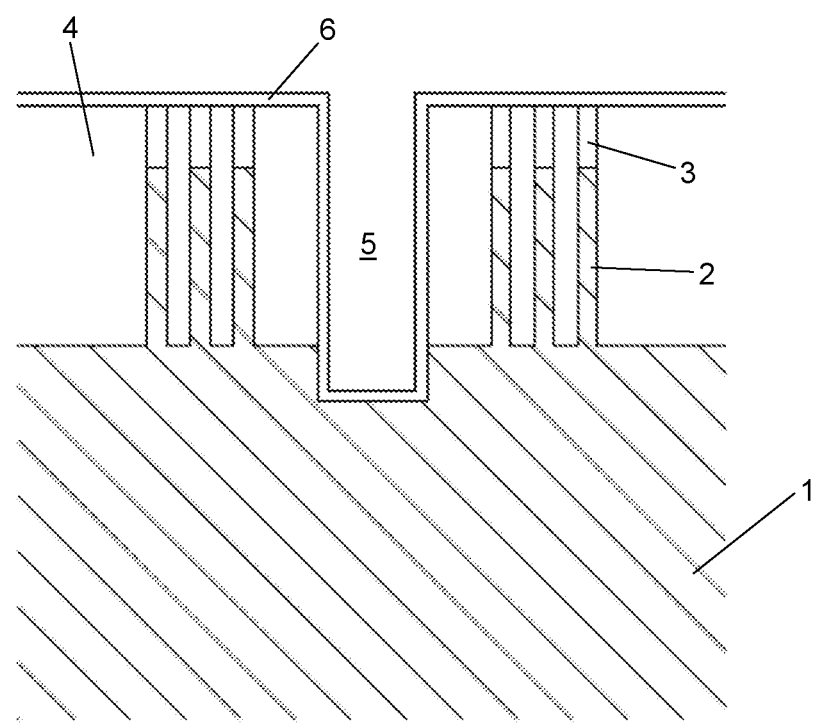

As described in European Patent Publication No. EP3324436, the fabrication of a buried interconnect rail between the two groups of fins enables the processing of a power delivery network that is entirely located on the back side of an IC produced on the device wafer. The method of the disclosed technology includes the same initial steps for producing such buried interconnect rails. First, a shallow trench isolation (STI) oxide 4 is deposited on the wafer, as illustrated in FIG. 1B. The STI is planarized by grinding and/or Chemical Mechanical polishing (CMP), stopping on the mask 3 on top of the fins 2. See FIG. 1C. These process steps are well-known and may be executed according to any suitable method, including well-established techniques and process parameters. By lithography and etching, a trench 5 is then produced between the two groups of fins (see FIG. 1D), and a dielectric liner 6 is deposited on the sidewalls and the bottom of the trench 5, as well as on the upper surface of the wafer (see FIG. 1E). The width of the trench 5 may be in the order of 20 to 100 nm. The dielectric liner 6 may, for example, be applied by Atomic Layer Deposition (ALD) at a thickness in the order of 5 to a few tens of nanometers. Aspects of these steps are also described in European Patent Publication No. EP3324436.

Figure 1F:
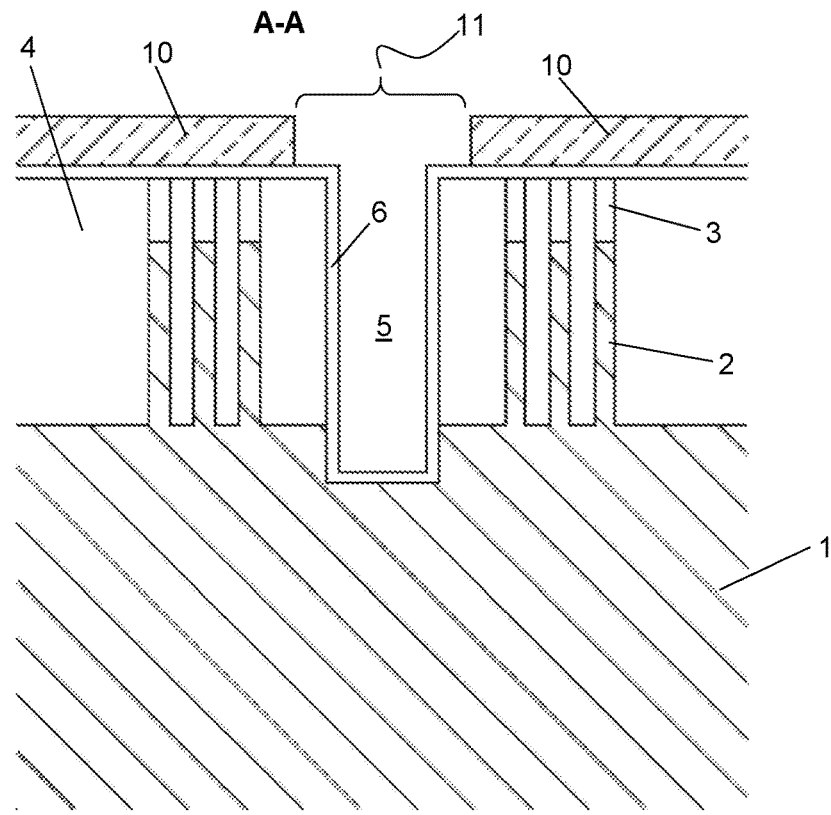
Figure 1F:
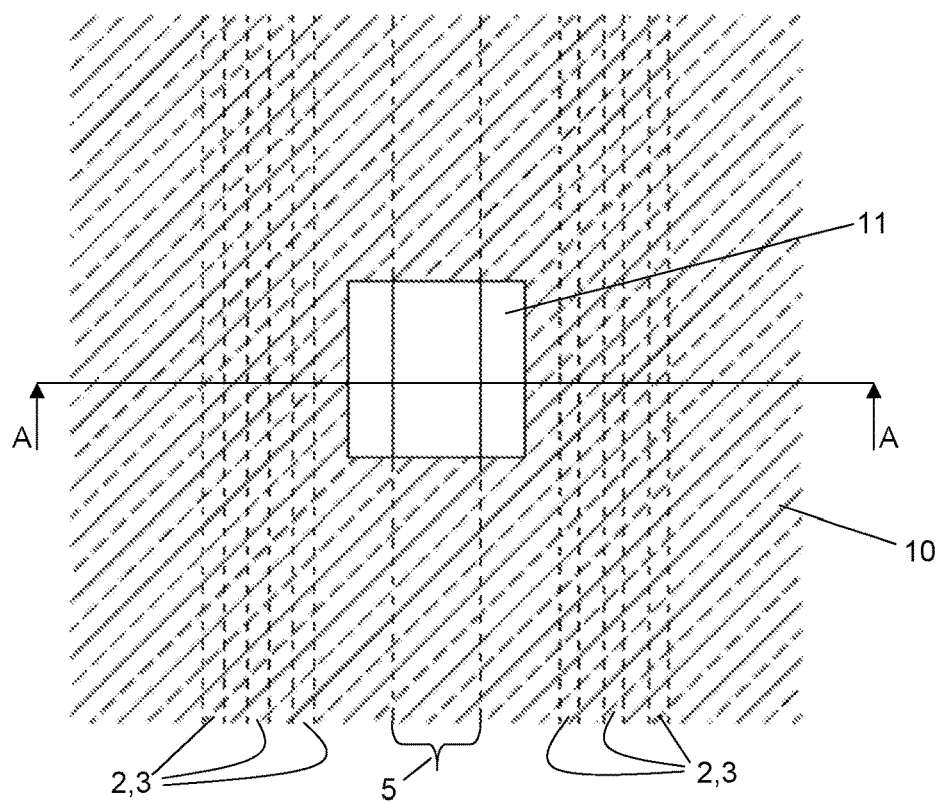

In contrast to the method described in European Patent Publication No. EP3324436, however, the trench 5 is not yet filled with an electrically conductive material at this point. A lithographic mask 10 is first produced on the wafer, as shown in FIG. 1F. This may be a photoresist layer or any other suitable mask layer. As seen in the plane view in FIG. 1F, the mask 10 covers the majority of the wafer surface except one or more areas 11 located above the trench 5. Only one such area is shown, but normally several areas of the trench as well as areas of other trenches across the device wafer are exposed in this way. The area is fully overlapping the trench in the direction transversal to the longitudinal direction of the trench, i.e. within this area 11 the trench 5 itself is fully exposed as well as portions of the wafer on either side of the trench.

Figure 1G:
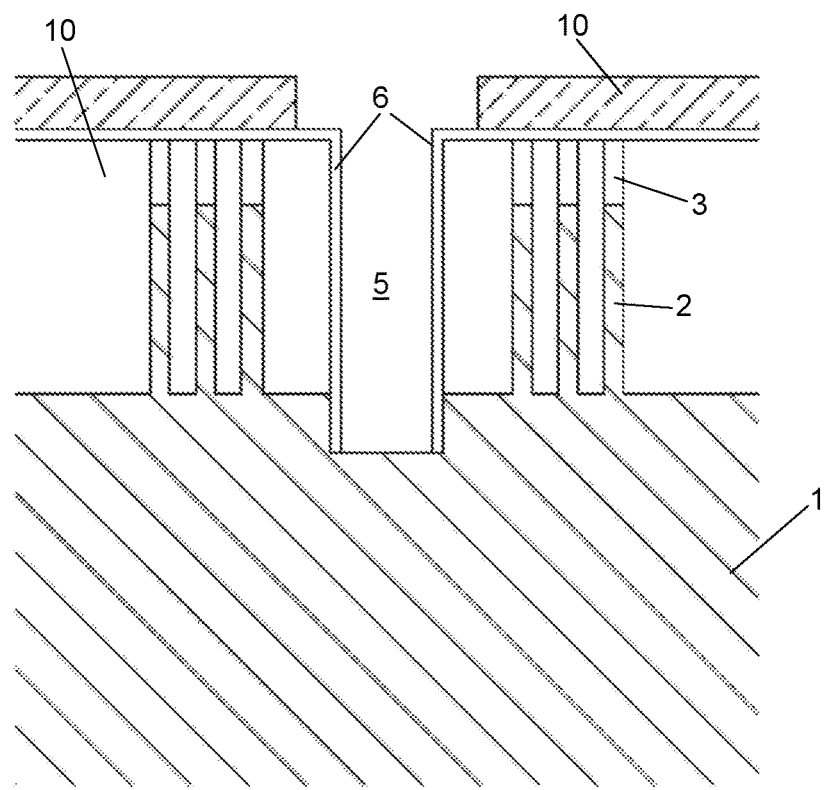
Figure 1H:
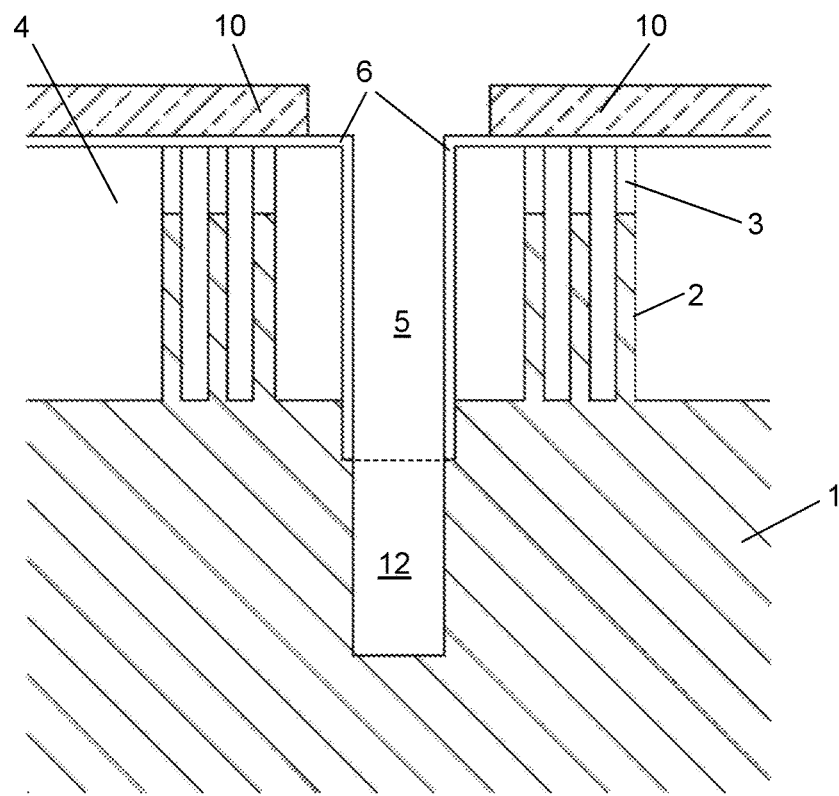

An etch step is then performed in the exposed area, as illustrated in FIG. 1G, whereby the liner 6 is removed on the bottom of the trench while maintaining the liner on the sidewalls. This may be done by a plasma-etch, as described for example in European Patent Publication No. EP3035369A1. As shown in FIG. 1H, a self-aligned anisotropic etch step is then performed, removing the monocrystalline silicon down to a given depth, thereby forming a blind cavity 12. Preferably the depth of the cavity 12 is in the order of 400 to 600 nm, starting from the bottom of the trench 5. The etch step for forming the cavity 12 is self-aligned with respect to the trench 5, as seen in the direction perpendicular to the trench, i.e. the cavity 12 has essentially the same width as the width of the trench 5. The etch steps for removing the liner and for removing the silicon may be performed in the same reactor, but with different etch chemistries, suitable respectively for the removal of the liner 6 and of the silicon. Such chemistries and further details of the etch processes can be suitably implemented by the skilled person and are therefore not described here in detail.

Figure 1I:
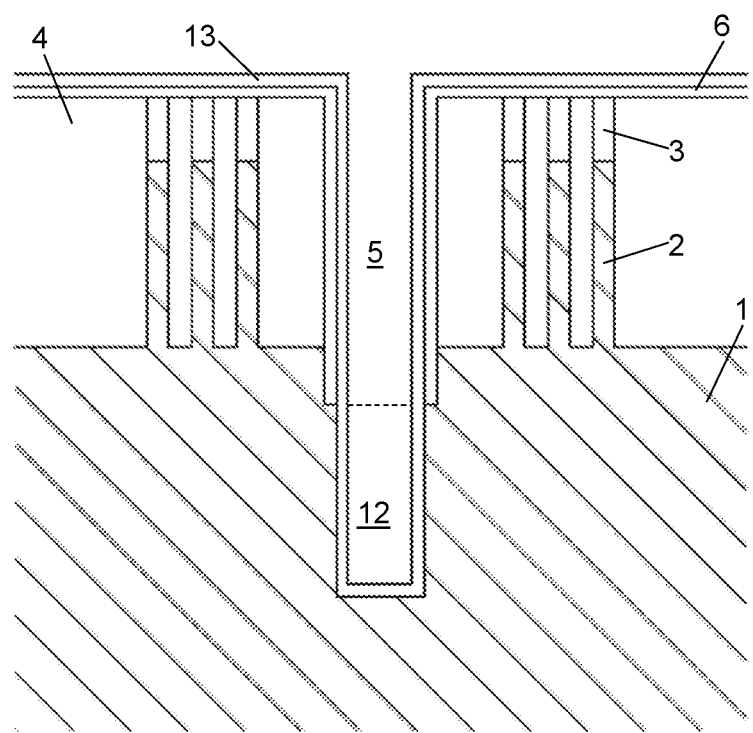
Figure 1J:
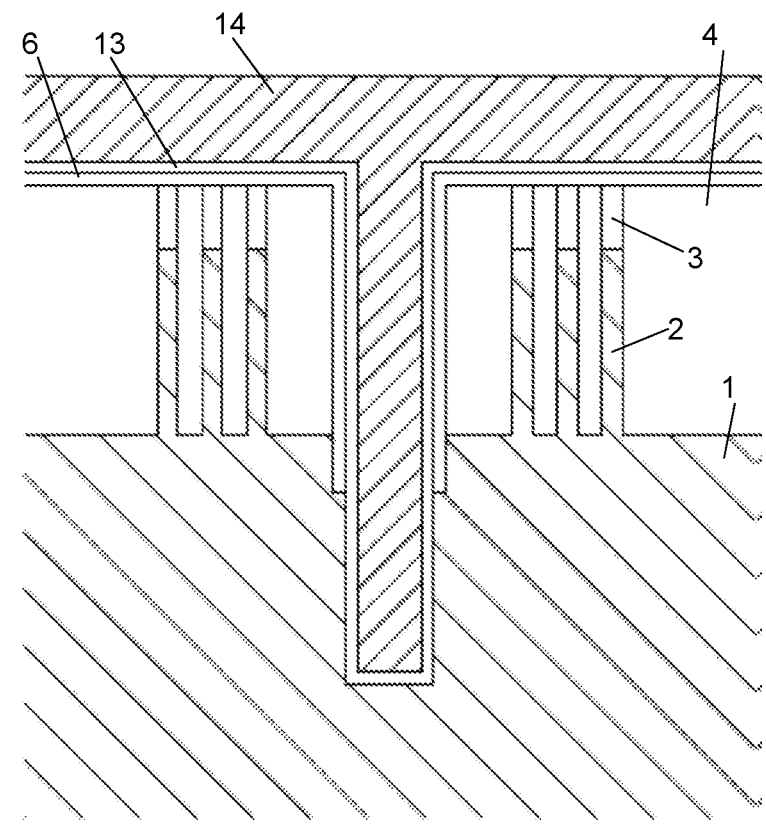

The result is an elongated trench 5 with the local blind cavity 12 at the location of the open area 11 defined by the mask 10. As seen in FIG. 1I, a second dielectric liner 13 is now deposited on the bottom and sidewalls of the cavity 12. This is followed by the deposition of a seed layer and a barrier layer (not shown) on the liner 13 in the trench 5 and in the cavity 12. These steps are known as such in the art as process steps which precede the deposition of an electrically conductive material. This deposition step of conductive material 14 is then applied, as shown in FIG. 1J. The conductive material may be highly doped silicon, or a metal such as tungsten or copper, applied by electrodeposition for example or by Chemical Vapor Deposition.

Figure 1K:
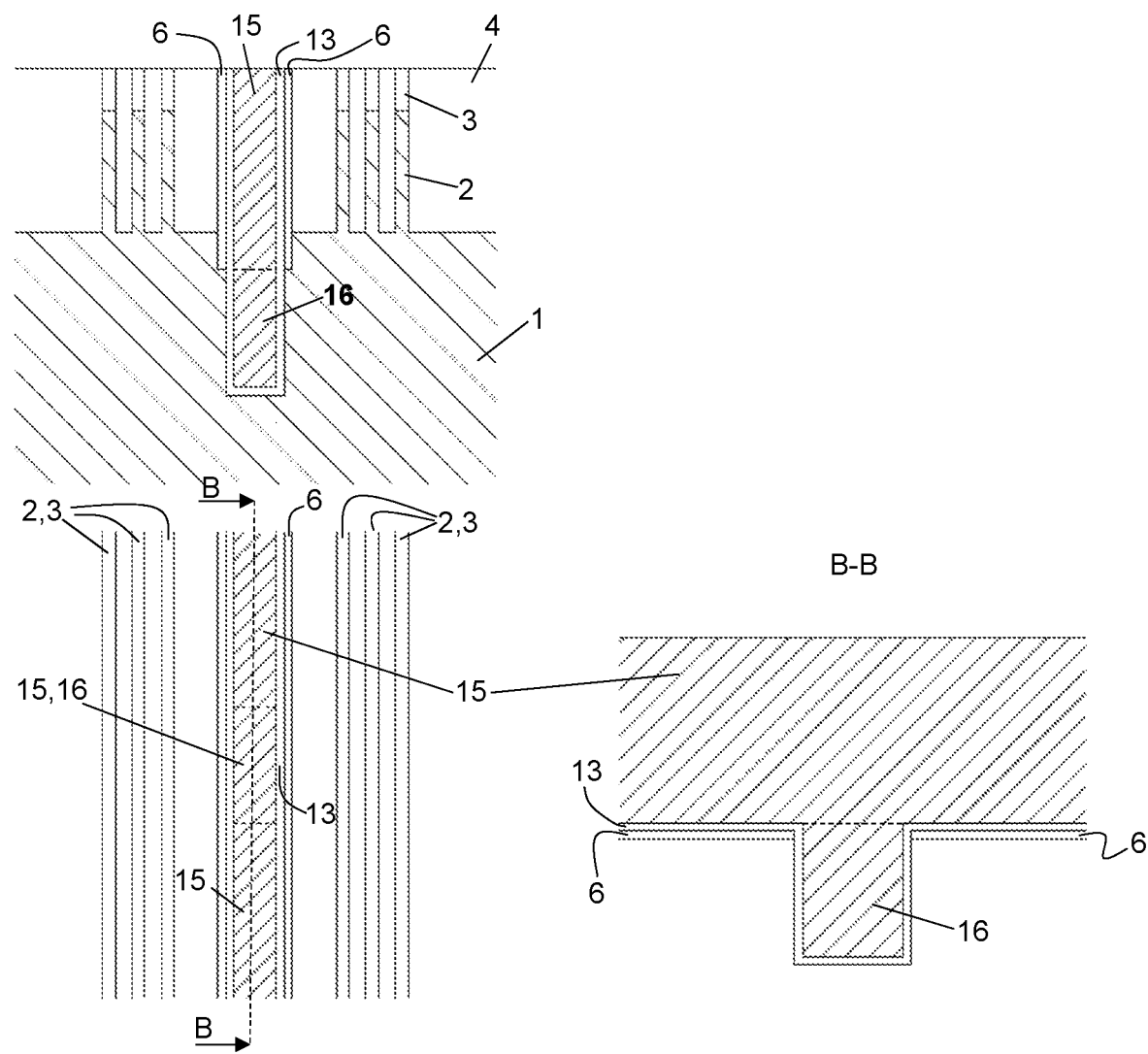

After planarization of the conductive material 14 and the liners 6 and 13 on the upper surface of the device wafer, stopping on the mask portions 3 on top of the fins 2, the structure illustrated in FIG. 1K is obtained. The filled trench forms an elongated rail 15, having one or more micro-TSVs 16 extending downward from the rail, and having essentially the same width as the rail 15. The term microTSV is used herein to indicate that the dimensions of these TSVs are smaller than what is usually termed a TSV in the terminology used in semiconductor processing.

The method for further processing the buried rail 15 and connecting it to the fins 2 involves etching back the conductive material of the rail and producing local interconnects between the rail on the one hand and active devices produced on the fins on the other hand. Back end of line processing is then performed on top of the fins to produce interconnects between the multiple active devices in the front end of line. This is described in European Patent Publication No. EP3324436, and may be executed in the same manner or any other suitable manner in the method of the disclosed technology.

Figure 2A:
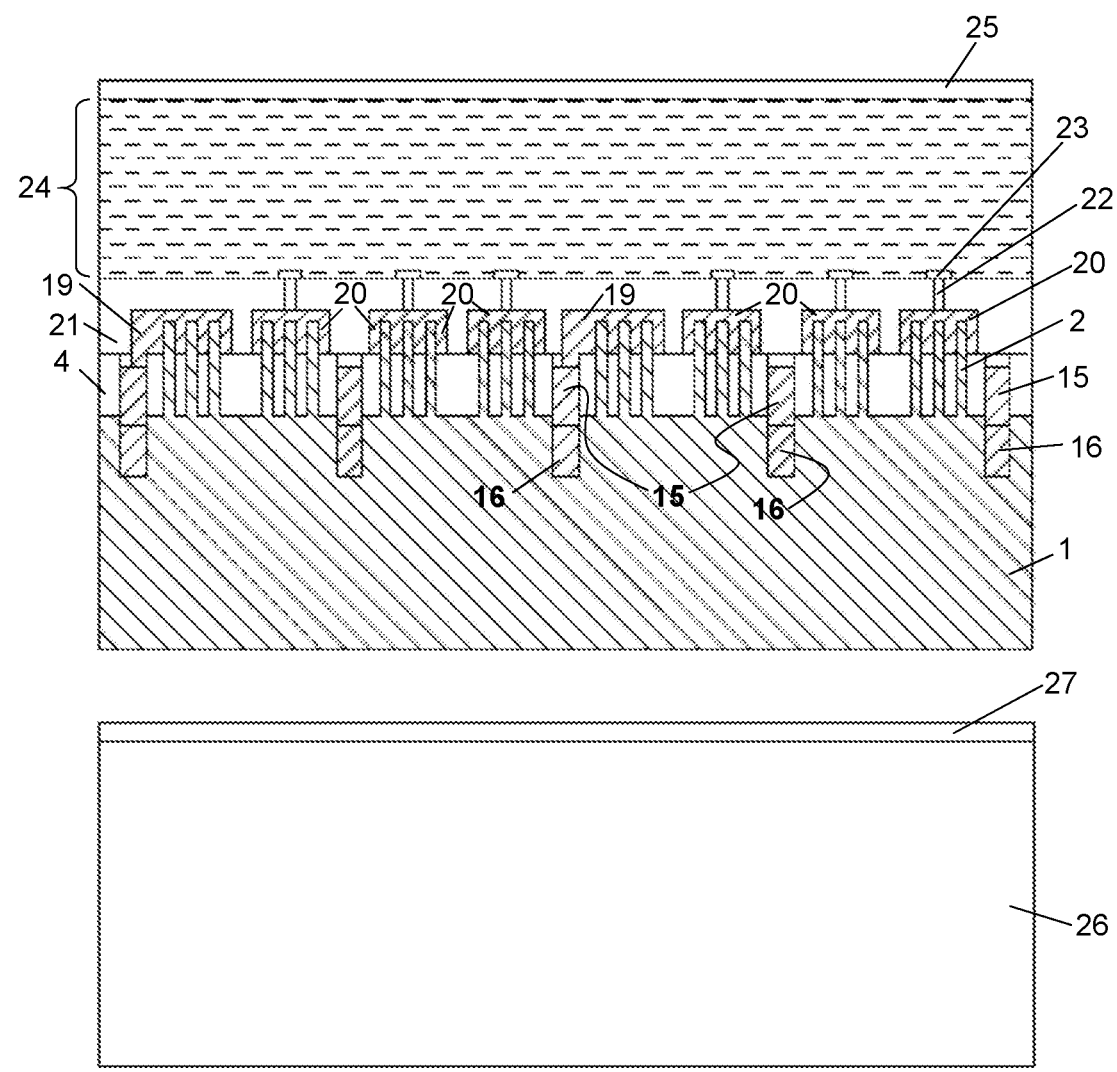
FIGS. 2A to 2F illustrate the method according to the disclosed technology, executed after bonding the device wafer to a landing wafer.

The result is a device wafer as shown in the upper portion of FIG. 2A, illustrating an area of the wafer comprising multiple groups of fins 2 embedded in the STI oxide 4, with buried rails 15 in between the groups, and the microTSVs 16 extending downward from the bottom of the rails 15. MicroTSVs are shown to extend from every rail in the cross-section shown in FIG. 2A. This is not a requirement, however, and in reality the TSVs will be distributed across the surface of the wafer in accordance with a predefined pattern, that may depend on the design of the PDN, as described also in European Patent Publication No. EP3324436.

Figure 2B:
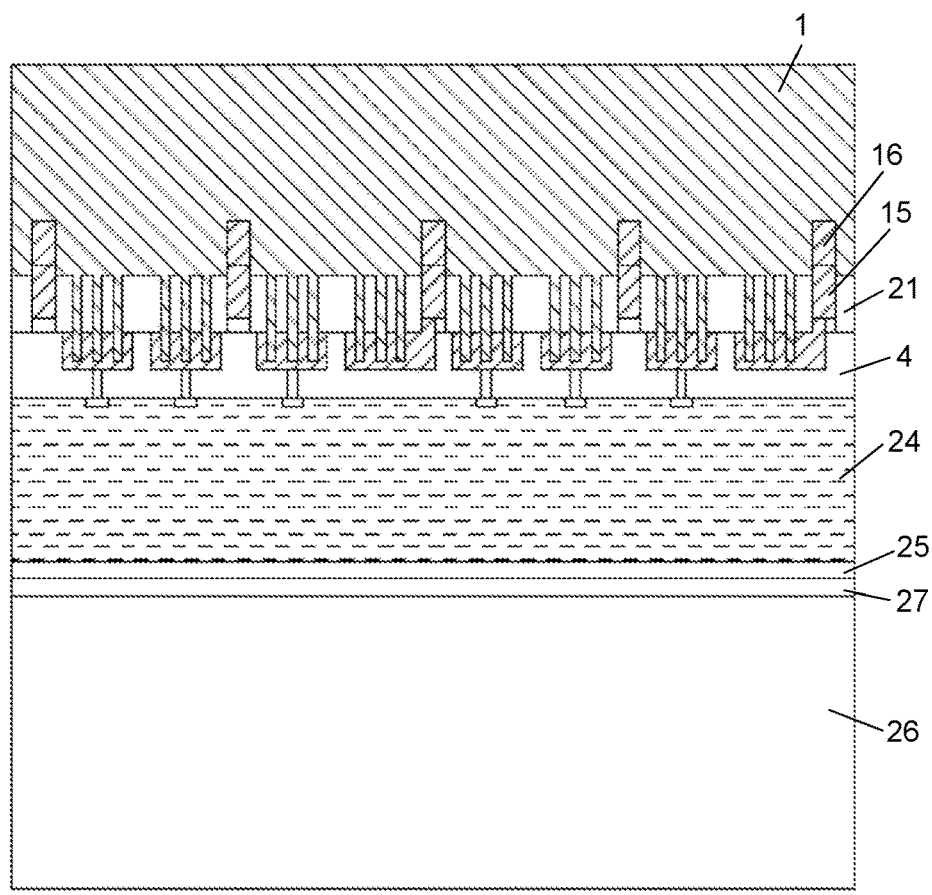

It is seen furthermore that the height of the rails 15 has been reduced, after which local interconnects 19 and local signal contacts 20 have been produced in accordance with the method described in European Patent Publication No. EP3324436. The dielectric liners 6 and 13 are present but have not been represented in FIG. 2A in order not to complicate the drawing and in order not to reduce the visibility of certain features. Also, gate strips and source/drain contacts have been produced on the fins, but these elements are equally not represented or not visible in the particular section shown in the drawings. The local interconnects 19 and local signal contacts 20 are embedded in a pre-metal dielectric layer 21. Via connections 22 connect the local signal contacts 20 to contact pads 23 in the first metallization layer of the back end of line stack 24. The local interconnects 19 connect source and drain areas of a number of active devices to the buried rails 15. A dielectric bonding layer 25 is furthermore applied on top of the BEOL stack 24. The lower portion of FIG. 2A shows a landing wafer 26, also including a dielectric bonding layer 27. These bonding layers 25 and 27 may be silicon oxide layers or SiCN layers, or any other layers applicable in direct bonding, i.e. bonding by directly contacting dielectric bonding layers, usually oxide layers which undergo chemical bonding, under the influence of increased contact pressure and/or increased temperature. Bonding of the device wafer to the landing wafer takes place by any suitable direct bonding techniques, thus obtaining a wafer assembly as shown in FIG. 2B. The landing wafer 26 may be a temporary carrier wafer, or another device wafer, or any other suitable substrate to which the device wafer may be attached.

Figure 2C:
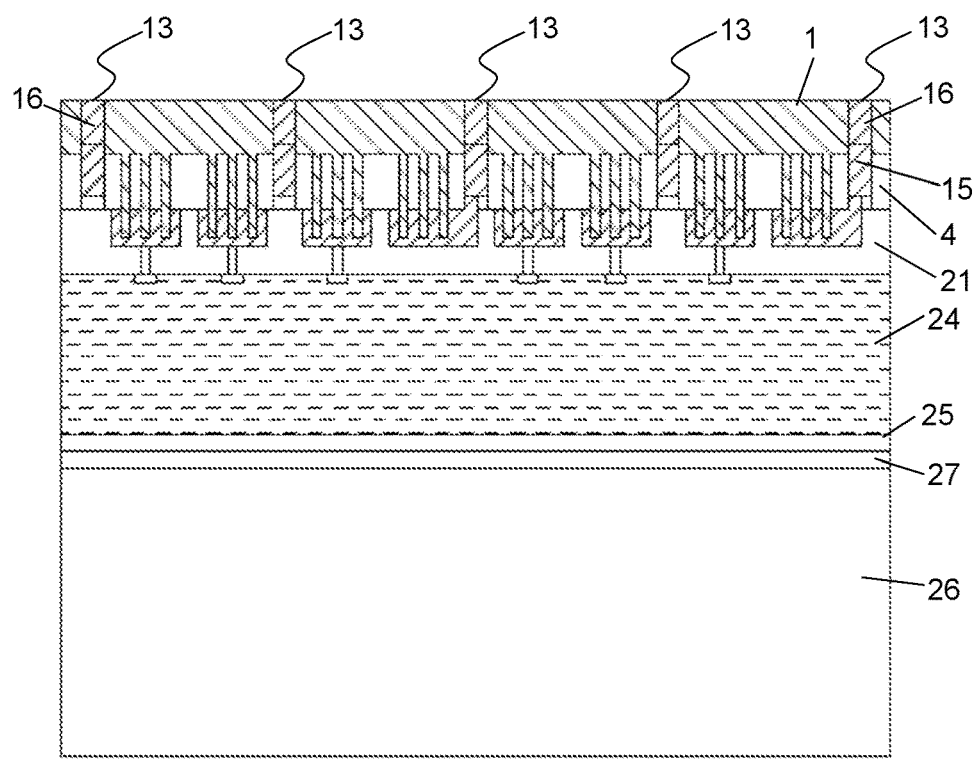
Figure 2D:
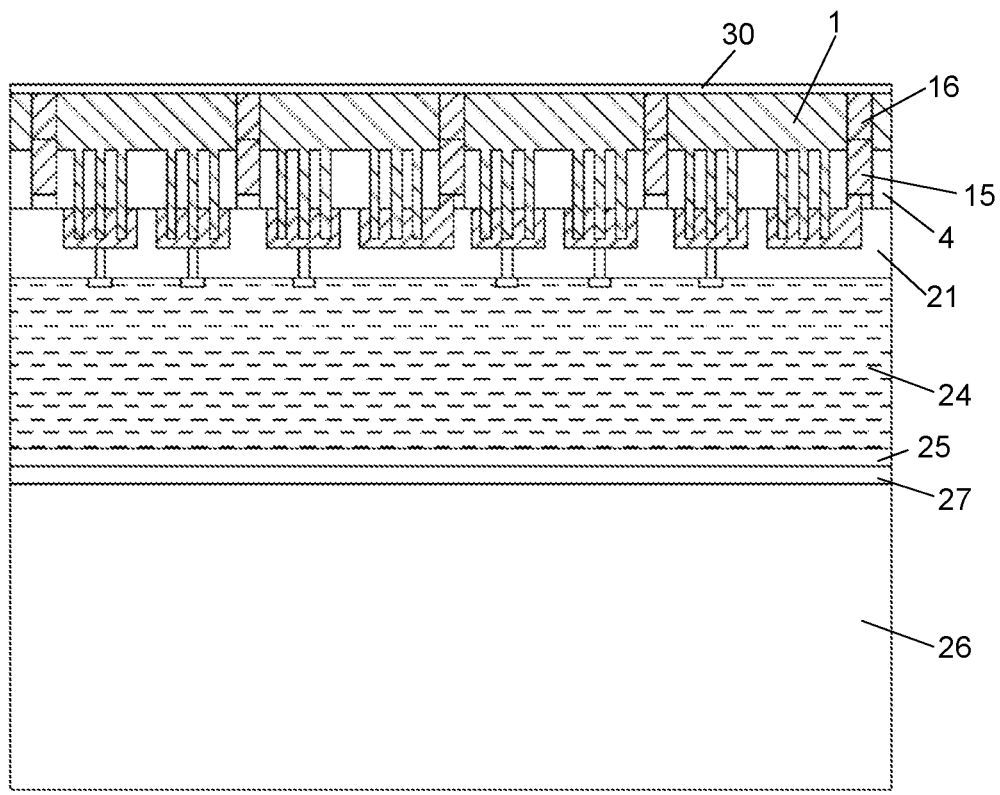
Figure 2E:
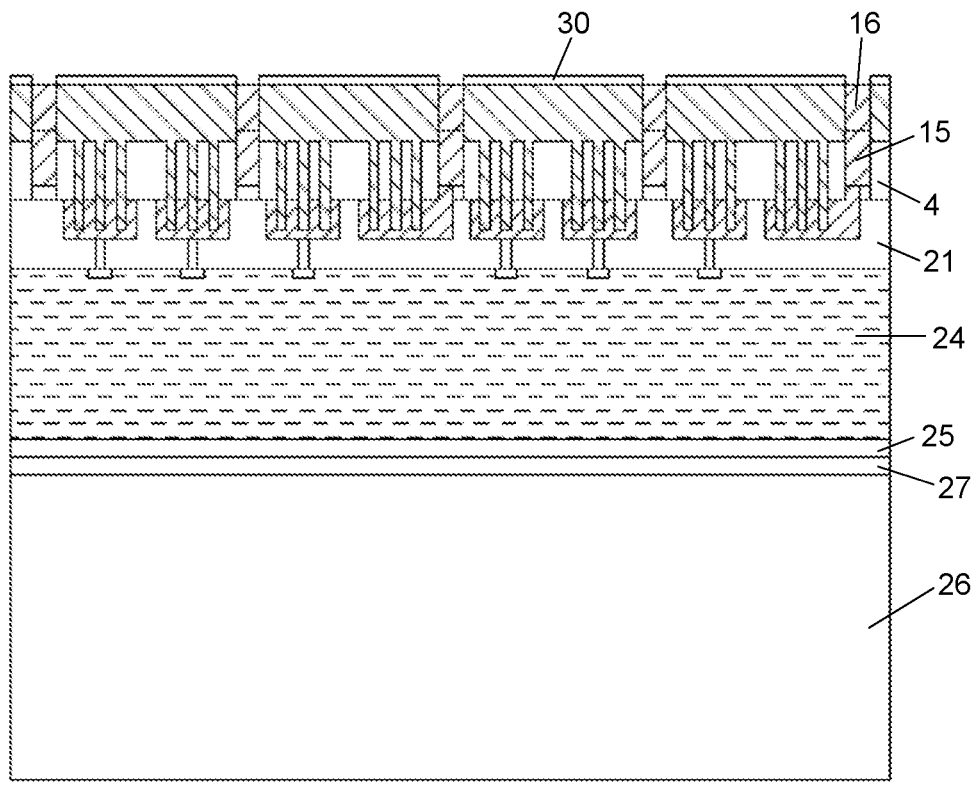
Figure 2F:
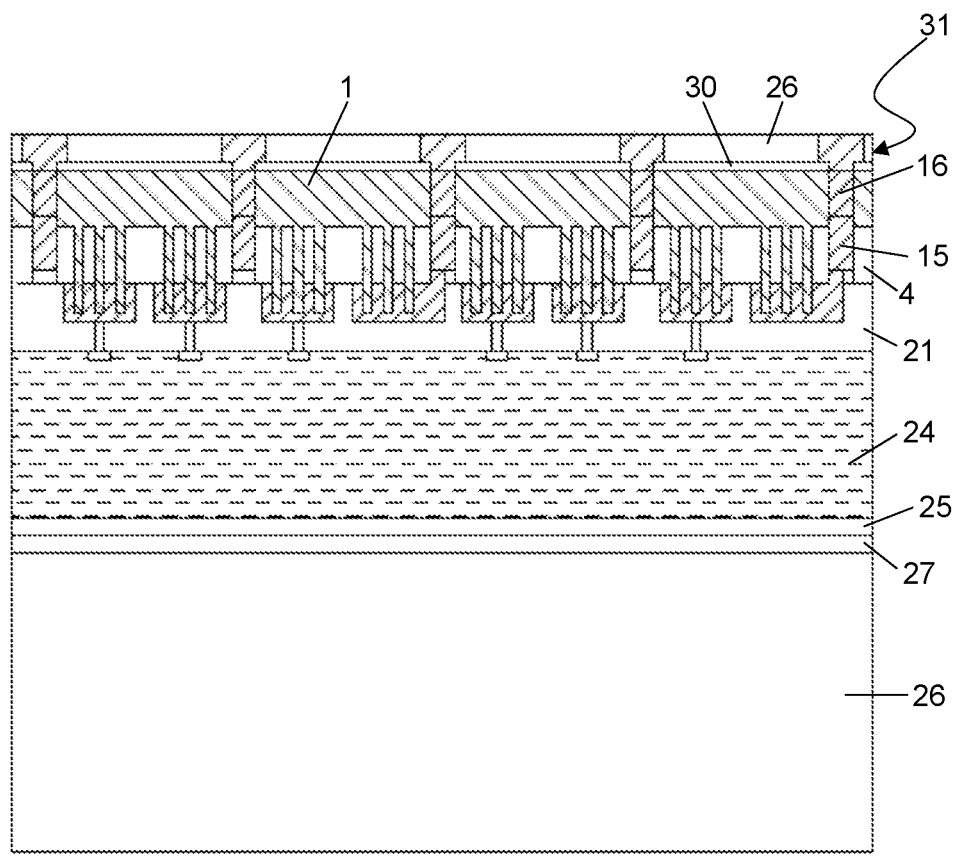

Thinning of the device wafer 1 is then performed by a series of thinning steps, including grinding and wet or dry etching, for example beginning with a grinding step, reducing the wafer to a thickness of 50 micrometers, CMP down to 49 micrometers, fast dry etching down to about 10 micrometers, and slow wet etching down to 1 micrometer or less. According to one embodiment, the slow wet etching continues until the liner 13 at the bottom of the microTSVs 16 is exposed, as illustrated in FIG. 2C. A slight overetch may be allowed, resulting in the TSVs 16 (including the liner 13) protruding from the thinned surface. FIG. 2C, however, shows the case wherein the thinned surface obtained by the slow etch process is essentially planar. A passivation layer 30 is then deposited. See FIG. 2D. The passivation layer 30 may be formed of SiON, SiCN or SICO for example. The thickness of the passivation layer 30 may, for example, be about 50 nm. The passivation layer 30 is opened by lithography and by etching. This same etching process or a subsequent etching process removes the liner 13 at the bottom of the microTSVs, thereby exposing the microTSVs 16 as such. See FIG. 2E. This is followed by standard damascene type processing, for producing a first metallization layer 31 of the power delivery network. See FIG. 2F. Additional metallization layers may be produced in accordance with the method described in European Patent Publication No. EP3324436 to arrive at a backside PDN having the same or other suitable connectivity as described in that document.

According to another embodiment, the liner 13 at the bottom of the microTSVs 16 is removed by chemical mechanical polishing, after the slow wet etch process. Preferably the CMP further removes any non-uniformities or possible protruding portions of the TSVs, resulting in a planarized semiconductor surface with exposed TSVs distributed across the surface. The CMP may be performed prior to depositing and patterning the passivation layer 30. Alternatively, CMP may be done after applying the passivation layer 30. In the latter case, the slow wet etch process is applied so as to overetch the semiconductor material 1 of the device wafer, resulting in the microTSVs 16 (including the liner 13) protruding outward from the thinned device wafer 1 at the end of the slow wet etch process. The passivation layer 30 is then applied on the topography defined by the protruding microTSVs, and the passivation layer is planarized by CMP, until the liner 13 is removed from the TSVs, as well as non-uniformities of the TSVs themselves, so as to obtain the planarized surface of the passivation layer 30, with exposed TSVs distributed across the surface. Standard process steps for producing the PDN are then performed.

The advantage of the method according to the disclosed technology in comparison with European Patent Publication No. EP3324436 is that the method includes self-aligned formation of the microTSVs 16 prior to the step of bonding the device wafer to a landing wafer and thinning the device wafer. The self-aligned manner, relative to the rails 15, in which the microTSVs 16 are formed allows perfect alignment of these microTSVs to the buried rails 15, regardless of the dimensions of the rails and TSVs.

Figure 3:
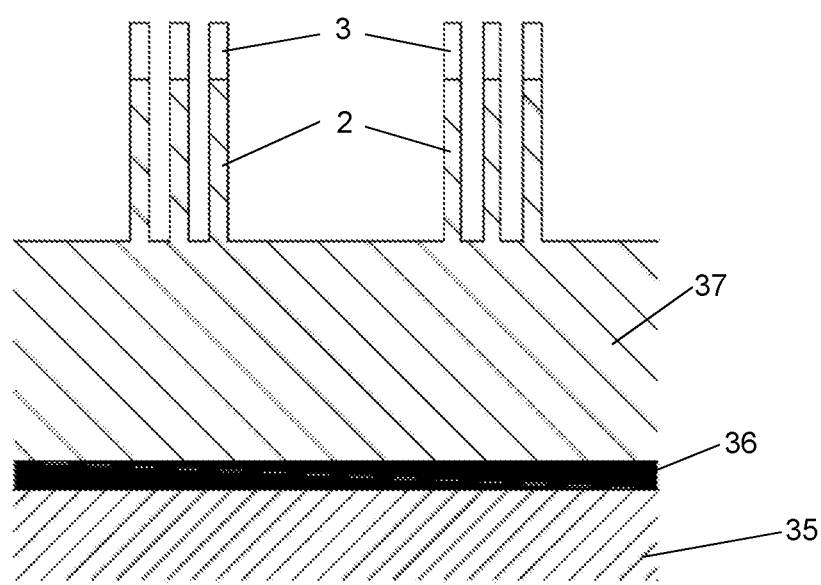
FIG. 3 illustrates a device wafer applicable in the method of the disclosed technology, including a silicon layer on top of a SiGe etch stop layer.
Figure 4A:
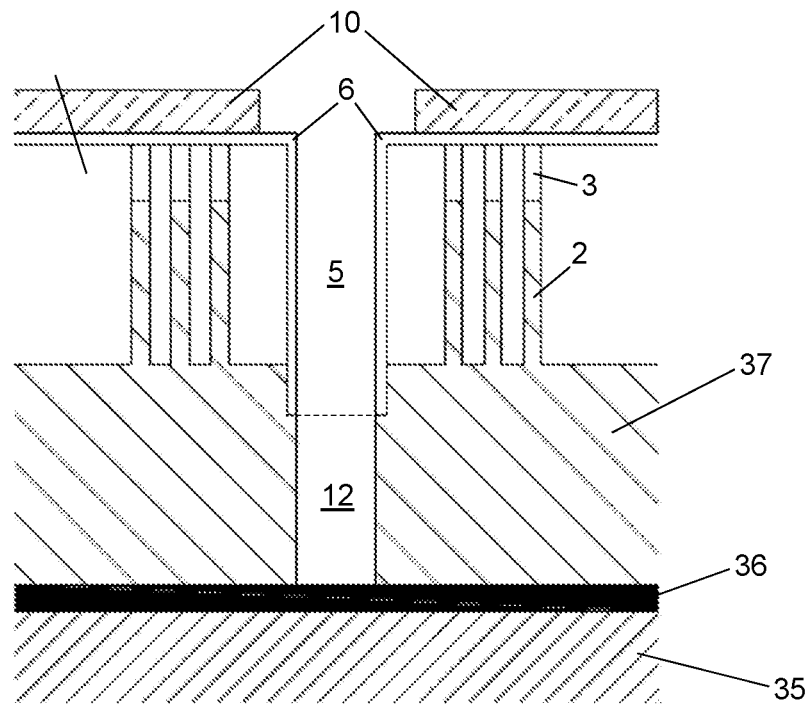
FIG. 4A illustrates that the SiGe layer may stop the self-aligned etching of the blind cavity needed to produce a microTSV.
Figure 4B:
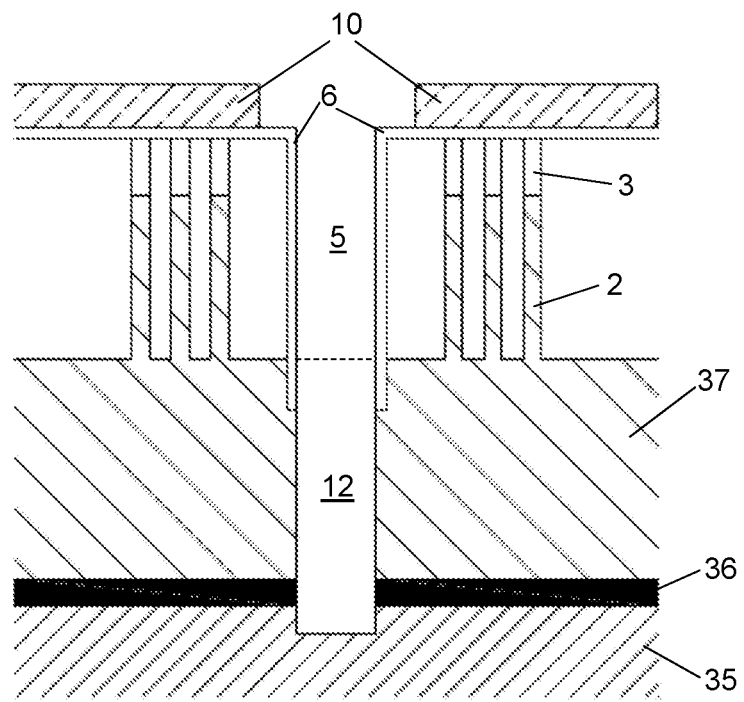
FIG. 4B illustrates an alternative embodiment wherein the SiGe layer does not stop this etching process and wherein the blind cavity protrudes slightly through the SiGe layer.

As stated above, the method of the disclosed technology may be applied on a multi-layer device wafer. According to an embodiment illustrated in FIG. 3, the device wafer is a bulk silicon substrate 35, including a SiGe layer 36 and a monocrystalline Si layer 37 on its surface. The fins 2 have been produced by lithography and etching in the layer 37, using a mask 3, as in the above-described embodiment. The SiGe layer 36 may have a thickness of about 50 nm. The monocrystalline Si layer 37 (prior to formation of the fins) may be in the order of 500 nm to one micrometer thick. The blind cavities 12 for producing the microTSVs 16 may either be etched down to the SiGe layer 36, i.e. the etch process may be selective to SiGe and thus stop on the SiGe layer, as illustrated in FIG. 4A. Alternatively, the etch process may be non-selective to SiGe and continue over a limited distance through the SiGe layer 36, as illustrated in FIG. 4B.

Figure 5A:
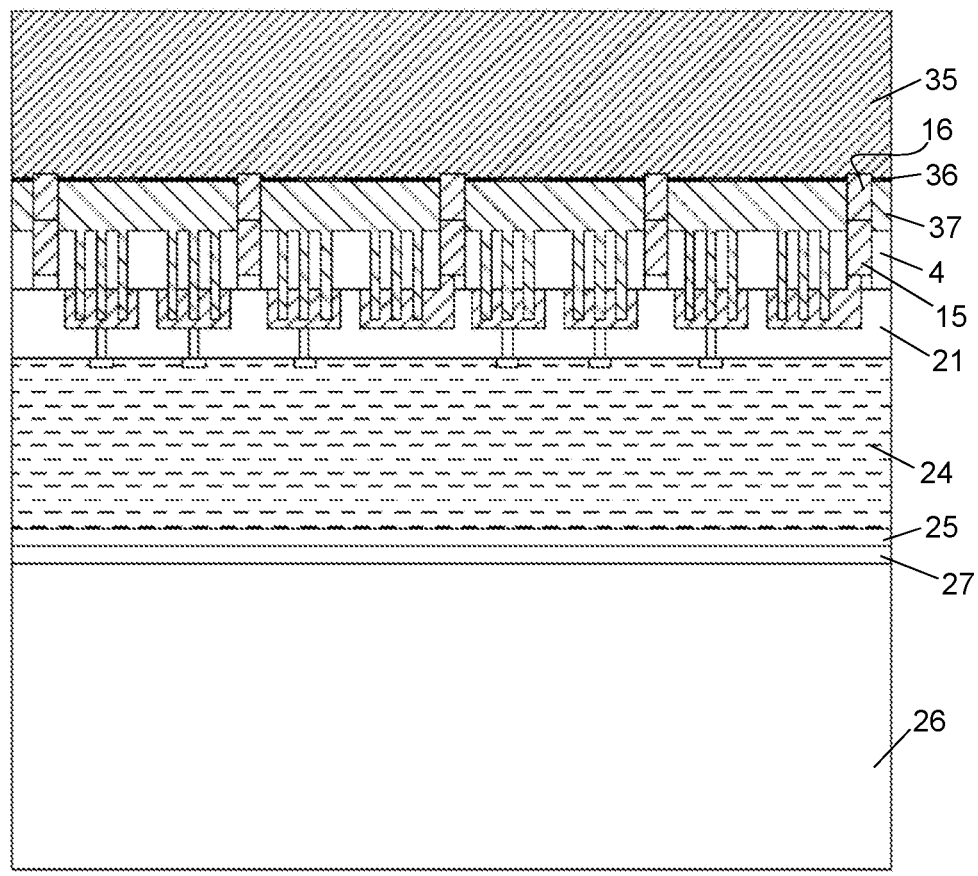
FIGS. 5A to 5C illustrate the etch stop function of the SiGe layer in the step of thinning the device wafer in accordance with the method of the disclosed technology.
Figure 5B:
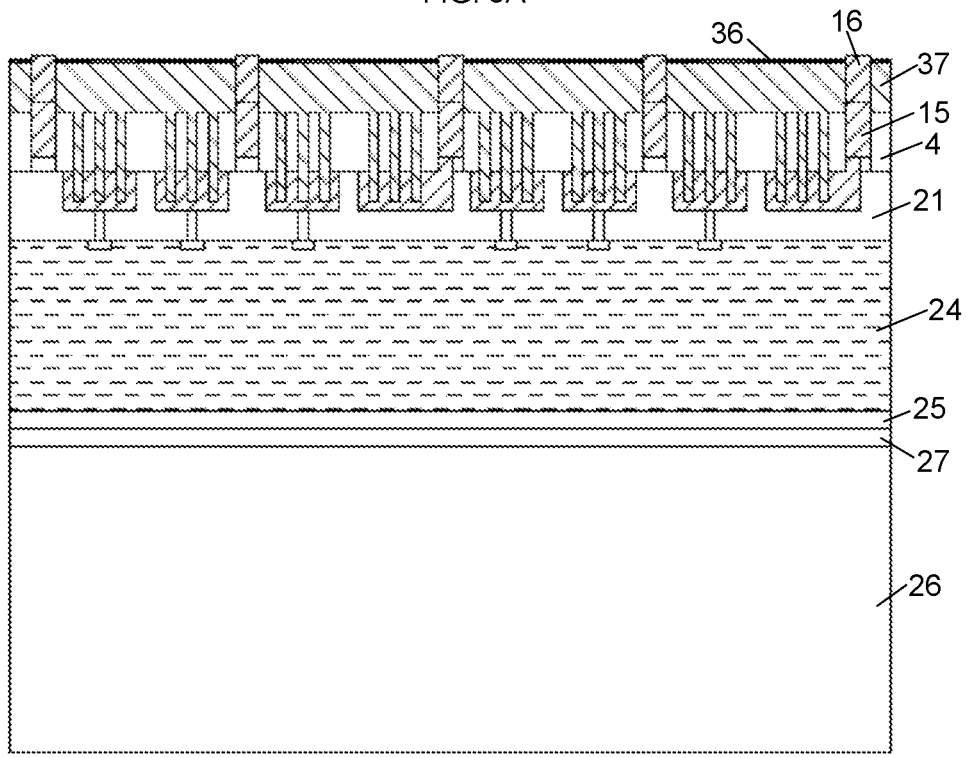
Figure 5C:
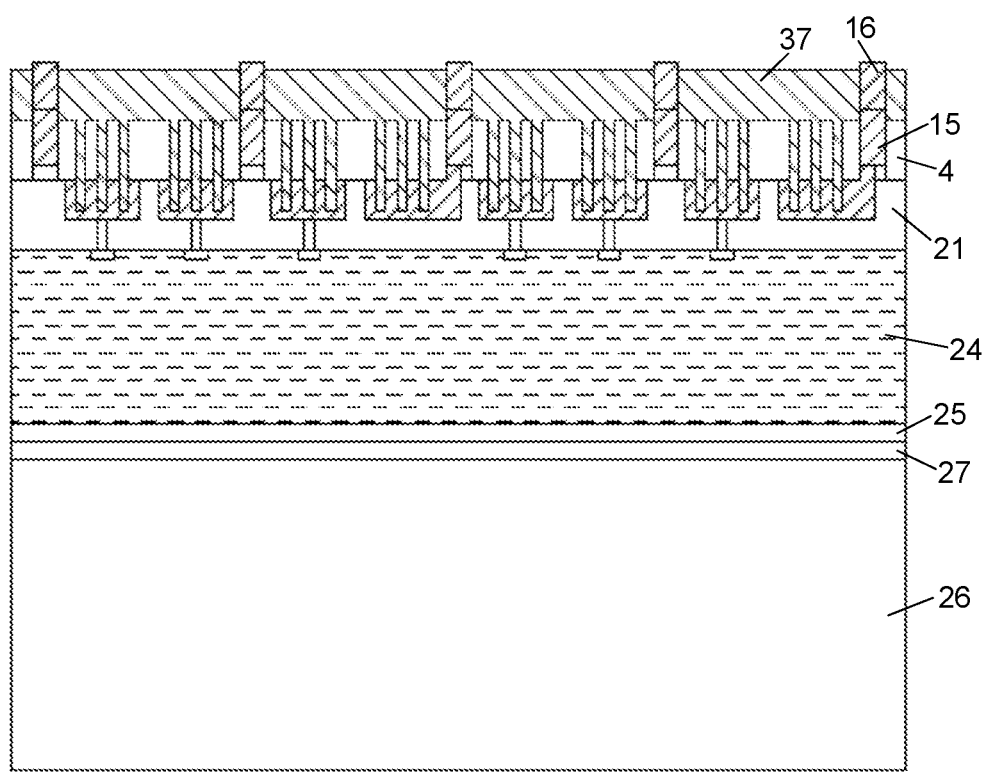

The main function of the SiGe layer 36 is to serve as an etch stop layer during the wet etch process applied for thinning the device wafer after bonding the wafer to the landing wafer. This is illustrated in FIGS. 5A to 5C for the case of FIG. 4B, i.e. the microTSVs 16 protrude slightly through the SiGe layer 36. FIG. 5A is the situation after bonding of the device wafer to the landing wafer 26, by direct bonding between the dielectric bonding layers 25 and 27 as described above. Thinning of the device wafer is performed by the series of thinning steps as described above, i.e. grinding and dry etch. Now the thinning process ends with a wet etch process that is highly selective to the SiGe 36 and to the material of the microTSVs 16, i.e. the Si of the bulk substrate 35 is removed but the SiGe layer 36 remains, as well as the microTSVs 16 (including the liner 13, not shown), as illustrated in FIG. 5B. The presence of the SiGe layer 36 facilitates the thinning of the wafer to a precisely known thickness. After the wet etch process, the SiGe layer 36 is removed by a dry or wet etch process that is highly selective to Si, thereby ensuring that the remaining surface is Si with the exposed microTSVs 16 slightly protruding from the Si, as shown in FIG. 5B. After this, the method is continued in the same way as described in relation to FIGS. 2D to 2F (removal of liner 13, deposition of passivation 30, etc.). The liner 13 may be removed by etching or by CMP, as described above. When the microTSVs are protruding from the Si, the above-described steps of depositing the passivation layer 30 on the topography defined by the protruding microTSVs, followed by a CMP step, may be applied to planarize the surface of the passivation layer, thereby removing the liner from the microTSVs.

According to an embodiment, the SiGe layer 36 includes between 20% and 30% Ge. Within this range, the selectivity of the wet etch process to the SiGe is sufficiently high, while the properties of the monocrystalline Si layer 37 are acceptable in terms of the strain and the smoothness of this layer.

An alternative multilayer structure that is suitable for the disclosed technology is a silicon-on-insulator (SOI) substrate, as known in the art. The insulator layer (normally a silicon oxide layer) in the SOI may play the same part as the SiGe layer in the previous embodiment. According to yet another embodiment, the method is applied on a bulk monocrystalline semiconductor substrate that has been provided with dopant elements by dopant implantation, in such a manner that the dopants form a layer at a depth comparable to the depth of the SiGe layer described above. The dopant layer performs the same function as the SiGe layer described above, i.e. forming an etch stop layer at least for the wet etching of the semiconductor material above the etch stop layer at the end of the thinning process.

As stated above, the method is not limited to the application on fin-shaped devices, but it is applicable to the production of buried interconnect rails amid any design and type of active devices on an IC.

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the disclosed technology, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A method of producing an integrated circuit chip comprising:

providing a device substrate comprising a semiconductor material at least on its upper surface;

producing a front end of line (FEOL) portion of the chip on the semiconductor material of the device substrate, wherein the FEOL portion comprises active devices and interconnect rails, the interconnect rails being at least partially embedded in a shallow trench isolation (STI) dielectric layer;

producing a back end of line (BEOL) portion on the FEOL portion;

bonding the device substrate to a landing substrate, with a surface of the BEOL portion being bonded to a surface of the landing substrate, and thereafter:

thinning the device substrate from the back side, and producing a power delivery network (PDN) on the thinned backside of the device substrate, wherein the PDN is connected to the interconnect rails by a plurality of through semiconductor vias (TSV) which are isolated from the semiconductor material of the device substrate by a dielectric liner, wherein:

the TSVs are formed during the production of the FEOL portion on the device substrate, the TSVs extending into the semiconductor material of the device substrate and being formed in a self-aligned manner with respect to the interconnect rails, the TSVs being self-aligned to the interconnect rails in the direction perpendicular to the interconnect rails, with the liner isolating the TSVs laterally and on the bottom of the TSVs, thinning the device substrate includes thinning the semiconductor material of the device substrate until the liner at the bottom of the TSVs is exposed, and the liner is subsequently removed from the bottom of the TSVs so as to allow the PDN to contact the TSVs, and wherein forming the interconnect rails and the TSVs comprises:

producing a trench through the STI dielectric layer and extending into the semiconductor material of the device substrate, providing a first dielectric liner on the bottom and the sidewalls of the trench, and thereafter:

providing a mask that defines at least one local open area extending across the longitudinal direction of the trench and on both sides of the trench, removing the liner from the bottom of the trench in the at least one local open area, and thereafter:

etching a blind cavity extending underneath the trench, by a self-aligned etch process in the at least one local open area, the etch process being self-aligned to the trench in the direction perpendicular to the longitudinal direction of the trench, providing a second dielectric liner on the bottom and the sidewalls of the blind cavity, and thereafter:

filling the blind cavity and the trench with an electrically conducting material, so as to create a rail having one of the TSVs extending locally and in a self-aligned manner from a bottom of the rail.

2. The method according to claim 1, wherein the device substrate comprises a base substrate, an etch stop layer on top of the base substrate, and the semiconductor material on top of the etch stop layer, and wherein thinning the device substrate comprises grinding and etching the base substrate from the back side, ending with an etch process that is stopped by the etch stop layer.

3. The method according to claim 2, wherein the base substrate is a silicon substrate, the etch stop layer is a SiGe layer, and the semiconductor material is a monocrystalline silicon layer.

4. The method according to claim 2, wherein the device substrate is a silicon-on-insulator substrate, comprising a silicon base substrate, an insulator layer acting as the etch stop layer, and a monocrystalline silicon layer on the insulator layer.

5. The method according to claim 2, wherein the device substrate is a monocrystalline substrate, and wherein the etch stop layer is formed by dopant elements implanted into the substrate and forming a layer at a given implant depth.

6. The method according to claim 2, wherein the etch stop layer furthermore stops the self-aligned etch process, so that the bottom of the blind cavity is formed by the etch stop layer.

7. The method according to claim 2, wherein the etch stop layer does not stop the self-aligned etch process, and wherein the self-aligned etch process is continued until the bottom of the blind cavity protrudes through the etch stop layer.

8. The method according to claim 1, further comprising, after thinning the device substrate:

if applicable, removing the etch stop layer;

depositing a passivation layer; and opening the passivation layer at the location of the TSVs by lithography and by an etch process, wherein removing the liner from the bottom of the TSVs so as to allow the PDN to contact the TSVs is performed by the etch process for opening the passivation layer, or by a subsequent etch process.

9. The method according to claim 1, wherein the liner is removed from the bottom of the TSVs by chemical mechanical polishing (CMP).

10. The method according to claim 9, wherein the TSVs, including the liner, protrude from the thinned back side of the device substrate after thinning the device substrate, and wherein a passivation layer is deposited on the thinned back side and on the protruding TSVs, followed by the CMP, wherein the CMP planarizes the surface of the passivation layer, thereby removing the liner from the bottom of the TSVs.

* * * * *